United States Patent [19]
Jones, Jr. et al.

[11] Patent Number: 6,010,927
[45] Date of Patent: Jan. 4, 2000

[54] METHOD FOR MAKING A FERROELECTRIC DEVICE HAVING A TANTALUM NITRIDE BARRIER LAYER

[75] Inventors: Robert E. Jones, Jr., Austin; Peir-Yung Chu, Pflugerville; Peter Zurcher, Dripping Springs; Ajay Jain, Austin, all of Tex.

[73] Assignee: Motorola, Inc., Schaumburg, Ill.

[21] Appl. No.: 08/959,554

[22] Filed: Oct. 28, 1997

Related U.S. Application Data

[62] Division of application No. 08/609,697, Mar. 1, 1996, Pat. No. 5,716,875.

[51] Int. Cl.$^7$ ................................................. H01L 21/8238
[52] U.S. Cl. ............................... 438/210; 438/3; 438/240; 438/653
[58] Field of Search .............................. 438/3, 210, 240, 438/253, 256, 396, 399, 643, 653

[56] References Cited

U.S. PATENT DOCUMENTS

| | | |
|---|---|---|
| 5,216,572 | 6/1993 | Larson et al. ............................ 438/3 |
| 5,438,023 | 8/1995 | Argo, Jr. et al. ........................ 438/3 |
| 5,496,759 | 3/1996 | Yue et al. ................................ 438/3 |
| 5,554,559 | 9/1996 | Wolters et al. .......................... 438/3 |
| 5,591,663 | 1/1997 | Nasu et al. .............................. 438/3 |
| 5,837,591 | 11/1998 | Shimada et al. ..................... 438/240 |
| 5,851,896 | 12/1998 | Summerfelt ......................... 438/396 |

*Primary Examiner*—Tuan H. Nguyen
*Attorney, Agent, or Firm*—Keith E. Witek

[57] ABSTRACT

A method for forming CMOS transistors and ferroelectric capacitors on a single substrate (10) with improved yield begins by forming CMOS transistors (37a, 37b, 40, 42). A hydrogen anneal using 4–5% hydrogen and a remainder nitrogen is performed to reduce dangling atomic bonds at the gate dielectric/substrate interface of the transistors (37a, 37b, 40, 42). A silicon nitride layer (48) is then deposited over the transistors and on the backside of the wafer substrate (10) in order to substantially encapsulate the effects of the hydrogen anneal to the CMOS transistors (37a, 37b, 40, 42). Ferroelectric capacitor layers (54, 58, 60, 62, 64) are formed overlying the nitride layer (48) where the ferroelectric capacitor layers (54, 58, 60, 62, 64) are oxygen annealed in pure $O_2$. The nitride layer (48) prevents the transistor hydrogen anneal from damaging the ferroelectric material by containing the hydrogen.

20 Claims, 7 Drawing Sheets

METHOD FOR MAKING A FERROELECTRIC DEVICE HAVING A TANTALUM NITRIDE BARRIER LAYER

This is a divisional of application Ser. No. 08/609,697, filed Mar. 01, 1996, now U.S. Pat. No. 5,716,875.

FIELD OF THE INVENTION

The present invention relates generally to semiconductor processing, and more particularly, to forming ferroelectric memory devices on semiconductor wafers.

BACKGROUND OF THE INVENTION

Ferroelectric memory cells and microcontrollers which contain ferroelectric memory portions are currently being manufactured or considered for high volume production. When manufacturing PMOS and/or NMOS transistors on a semiconductor substrate, the PMOS and/or NMOS transistors are usually exposed to a hydrogen anneal process. This hydrogen anneal process neutralizes dangling bonds and reduces surface charge problems at the substrate-to-gate-oxide interface of the PMOS and/or NMOS transistors. Therefore, the hydrogen anneal greatly enhances transistor yield, where electrical breakdown of gate dielectrics are reduced and threshold voltage (Vt) shifts are minimized. However, the hydrogen anneal process incorporates hydrogen into the substrate and this hydrogen anneal is damaging to the deposited ferroelectric material. Therefore, when integrating NMOS and/or PMOS transistors onto an integrated circuit substrate along with ferroelectric capacitors, a hydrogen anneal may be used to improve the yield of CMOS transistors, however, this anneal process creates a yield reduction in the ferroelectric capacitors which overlie the CMOS transistors. The total yield of the IC is probably not significantly improved by the hydrogen anneal and the yield may even be reduced when using a conventional transistor hydrogen anneal methodology due to increased ferroelectric failure rates.

Instead of performing a hydrogen anneal, an oxygen anneal may be used to improve the yield of ferroelectric capacitors. However, an oxygen anneal can typically damage underlying PMOS and NMOS transistors. Therefore, if hydrogen anneal processes are used as known in the prior art, CMOS transistors in the substrate are improved in yield while ferroelectric capacitors overlying the transistors are damaged. In the alternative, when using an oxygen anneal, the ferroelectric capacitors are improved in yield while the transistors within the substrate are either damaged or not properly annealed to remove transistor process damage so that the yield of the transistors are inadequate. Therefore, there is no method in the prior art for annealing both ferroelectric and transistor devices on a single integrated circuit substrate to enhance the yield of both the ferroelectric capacitors and the yield of the transistors simultaneously to enhance overall IC yield. The need exists, in order to reduce costs and provide a better manufactured integrated circuit, to provide an annealing methodology which allows for high yield ferroelectric capacitors to be integrated with high yield PMOS and NMOS transistors in a single process flow.

Figure 1:
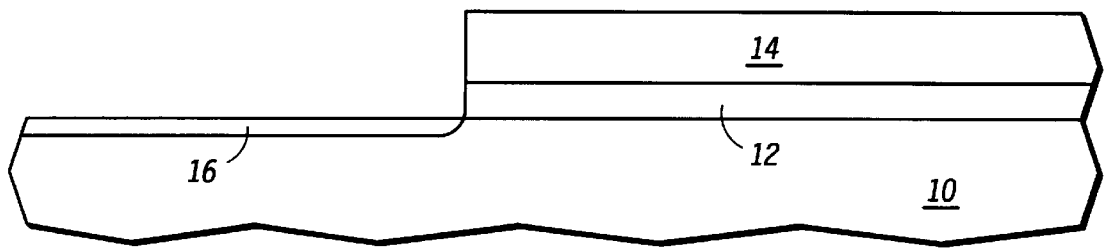
FIGS. 1–14 illustrate, in cross sectional diagrams, a method for forming a ferroelectric cell in accordance with the present invention.

It will be appreciated that for simplicity and clarity of illustration, elements illustrated in the FIGURES have not necssarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a method for manufacturing a ferroelectric memory device and a resulting ferroelectric memory structure. The ferroelectric process begins by manufacturing N-type and P-type CMOS transistor structures in a substrate. The CMOS transistors are then annealed in a hydrogen anneal at roughly 390° C. (typically a temperature between 200° C. and 500° C. is used). The hydrogen anneal involves exposing the wafers to an ambient that contains 4–5% hydrogen and a remainder nitrogen. The hydrogen anneal is performed after manufacturing the CMOS transistors in order to neutralize dangling bonds or Qss charge at the silicon-gate oxide interface near polysilicon gate electrodes. This reduction of dangling bonds at the gate oxide/substrate interface of CMOS transistors stabilizes threshold voltages (Vt) and increases yield of the transistors. After the hydrogen anneal, a silicon nitride layer which is typically 450 mangstroms thick is deposited. This silicon nitride layer is deposited on the backside of the wafer as well as the front side of the wafer. The silicon nitride layer contains the hydrogen atoms from the hydrogen anneal to the CMOS transistors and surrounding layers for transistor yield improvement while preventing the hydrogen from out-defusing and damaging subsequent ferroelectric processing.

After depositing the silicon nitride layer, ferroelectric capacitor processing begins. In a preferred form, a strontium bismuth tantalum oxide is used as the ferroelectric dielectric for a ferroelectric capacitor which overlies the CMOS transistors. Strontium bismuth tantalum oxide is typically denoted as Y1 and has the chemical symbol $SrBi_2Ta_2O_9$. It is important to note that other ferroelectric materials may be used as the ferroelectric capacitor material. Contact openings are then etched to the electrodes of the ferroelectric capacitor and the transistors formed on the substrate. A tantalum nitride barrier is deposited for the first metallic layer of aluminum (typically 98%/1%/1% aluminum/silicon/copper) that will fill these contact openings. The tantalum nitride is used as a barrier between the platinum electrodes of the ferroelectric capacitor and aluminum. The tantalum nitride is also used as a barrier between aluminum and silicon substrate material. The tantalum nitride will further encapsulate the hydrogen from the transistor hydrogen anneal previously discussed to the transistor areas and keep the hydrogen anneal from affecting subsequent ferroelectric processing.

After complete formation of the ferroelectric capacitor and the metal interconnects, an oxygen anneal is performed to crystalize the ferroelectric material. When depositing and etching the ferroelectric material and any subsequent material, mechanical and plasma charge damage renders the ferroelectric material inoperable. An oxygen anneal is required in order to cure defects and damage in the ferroelectric material to increase the yield of the ferroelectric material and improve operation of the ferroelectric device. A typical oxygen anneal occurs at 400° C. (between 300° C. and 500° C.) and the ambient is pure oxygen ($O_2$).

It is important to note that the oxygen anneal, while greatly improving the performance of ferroelectric devices, greatly hinders performance of transistors. Therefore, the silicon nitride layer and tantalum nitride barrier which were previously deposited and discussed above are used to separate the effects of the hydrogen anneal from the effects of the oxygen anneal. In other words, the silicon nitride layer contains all of the hydrogen advantages of the hydrogen anneal to the CMOS transistors while preventing hydrogen from damaging the ferroelectric capacitor array which overlies the CMOS transistors. In addition, the silicon nitride layer allows the oxygen anneal to improve the performance of the ferroelectric capacitors while not allowing the oxygen anneal to damage the underlying CMOS transistors.

Therefore, by using the process outlined above, a ferroelectric device containing optimized transistors via a hydrogen anneal and optimized ferroelectric capacitors via an oxygen anneal can be formed on a single substrate where the detrimental effects of transistor performance via oxygen anneals are avoided and the detrimental effects to ferroelectric materials via hydrogen anneals are avoided. The resulting product is a high yield, high performance CMOS ferroelectric product that has not yet been manufactured in the integrated circuit industry.

The above outlined process can be better understood with reference to FIGS. 1–14.

FIG. 1 illustrates the beginning of a process used to form a ferroelectric integrated circuit having high performance and high yield. In FIG. 1, a substrate 10 is provided. In a preferred form, substrate 10 is a N-type silicon semiconductor wafer. In other forms, the substrate 10 may be a silicon on insulator (SOI) substrate, a gallium arsenide substrate, a germanium doped substrate, either an N-type or a P-type silicon wafer, a wafer bonded substrate, or any like semiconductor wafer starting material. The wafers are laser scribed with an identification number for manufacturing identification. A thin oxide layer (not specifically illustrated in FIG. 1) is formed followed by the deposition of a thicker nitride layer 12. A photoresist layer 14 is spun on top of the silicon nitride layer 12. The photoresist layer 14 is exposed to light and chemically developed selectively via a lithographic masking process. An etch procedure is then used to etch away portions of the silicon nitride layer 12 exposed by the developed photoresist layer 14. An N-type ion implant step is used to implant phosphorous within exposed regions of the substrate 10 to form an N doped region of the substrate 10 referred to as doped region 16. A typical implant process for forming the region 16 occurs between 80 Kev and 120 Kev and involves phosphorous implantation at a surface area dose on the order of $1 \times 10^{13}$ atoms/cm$^2$.

Figure 2:
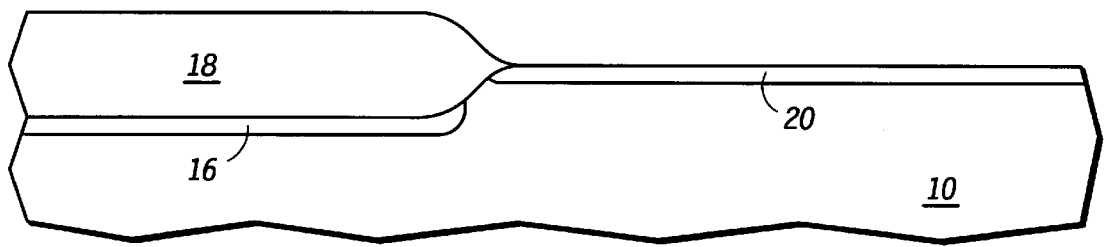

FIG. 2 illustrates that the photoresist layer 14 is stripped from the substrate via an ash process. Following resist removal, a top surface of the region 16 is oxidized via a thermal oxide growth process illustrated in FIG. 2. The thermal oxide growth process results in a thick 2,500–4,500 angstrom well oxide region 18. Phosphorous in the region 16 will "snowplow" underneath the oxide portion 18, meaning that the segregation coefficient of phosphorus into oxide is such that the phosphorus resists being consumed by the oxide and instead piles up at the interface of the oxide/silicon growth region. After formation of the oxide 18, the nitride layer 12 is etched via known nitride etch processing. The layer 18 is then used as an implant mask to ion implant boron into the substrate 10 to form a boron doped region 20. Typical energy for the boron implant is between 25 Kev and 45 Kev and the dose implanted is on the order of $1 \times 10^{12}$ atoms/cm$^2$ to $1 \times 10^{13}$ atoms/cm$^2$.

Figure 3:
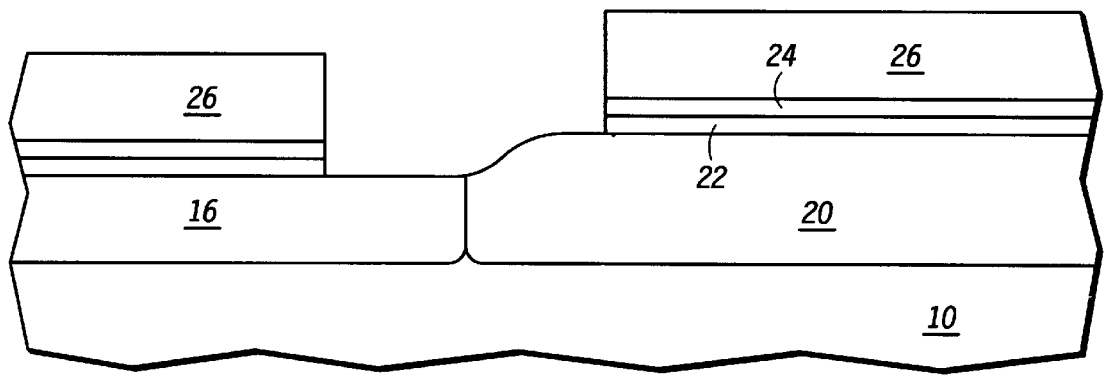

FIG. 3 illustrates that a thermal well drive process is used to thermally drive/diffuse the dopant atoms in regions 16 and 20 deeper into the substrate to form N-well region 16 and P-well region 20. After the thermal drive process is used to form the well regions, the oxide layer 18 is exposed to an etch environment and removed from the substrate 10. A 300–650 angstrom oxide layer 22 is formed overlying the well regions 16 and 20. A 1,200 to 1,800 angstrom silicon nitride layer 24 is deposited overlying the layer 22. Photoresist 26 is spun on the wafer and patterned as indicated in FIG. 3. Exposed portions of layers 24 and 22 which overlie an interface region of the wells 16 and 20 are etched as illustrated in FIG. 3. After the etching of the openings through layers 22 and 24, the photoresist 26 is stripped via an ash process in FIG. 4.

Figure 4:
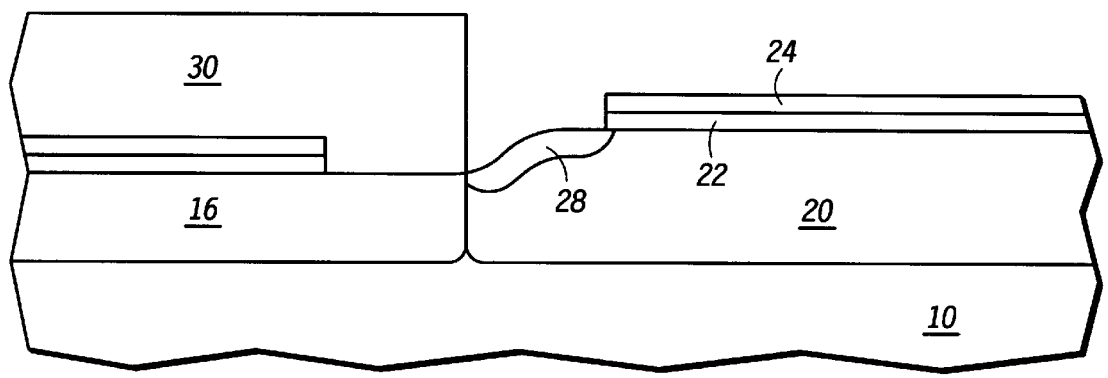

In FIG. 4, another photoresist layer 30 is deposited on the substrate and patterned as illustrated in FIG. 4. Photoresist 30 and layers 24–22 are then used as a hard/soft masking area for an ion implantation step which implants boron to form a region 28 within well 20. The ion implant step used to form the region 28 is a low energy implant which places $1 \times 10^{13}$ to $1 \times 10^{14}$ boron atoms per centimeter squared into a field oxide isolation region of the P-well 20.

Figure 5:
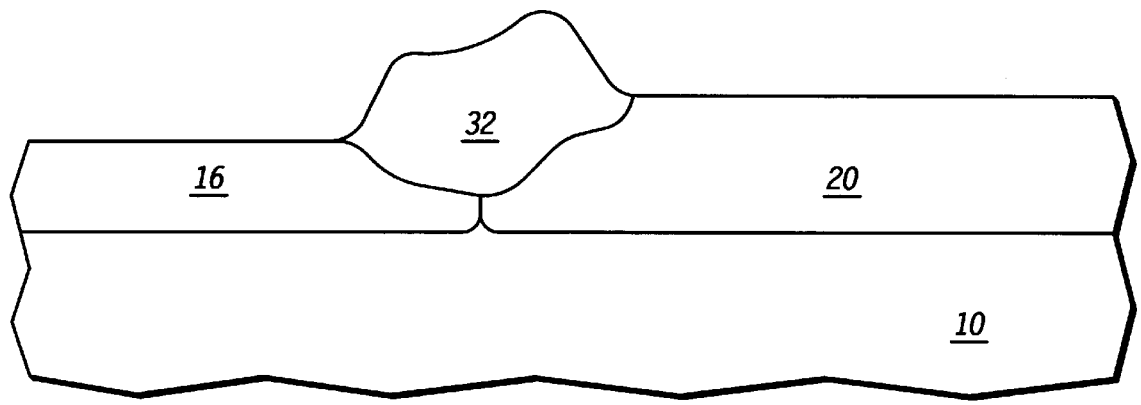

In FIG. 5, the photoresist layer 30 is stripped from the substrate, and field oxide region 32 is grown in the opening of layers 24 and 22. The presence of the silicon nitride layer 24 limits the effects of birds beak in the oxide region 32 illustrated in FIG. 5. A typical thickness for the field oxide isolation region 32 is within a range of roughly 5,000 angstroms to 10,000 angstroms in thickness. After formation of the field oxide region 32, layers 22 and 24 are removed from the wafer via oxide/nitride etch processing.

Figure 6:
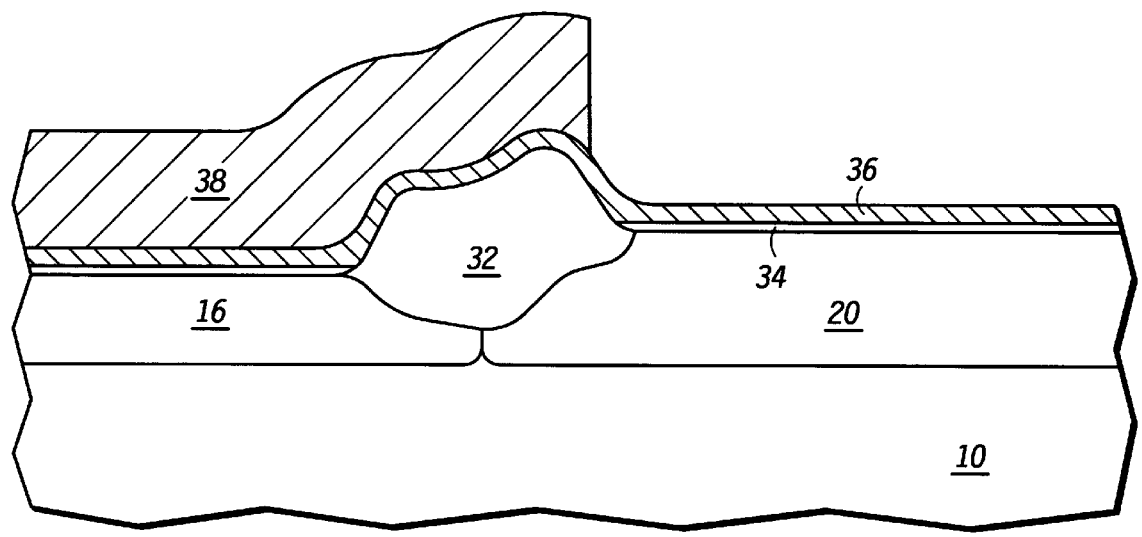

After formation of the field oxide region 32, FIG. 6 illustrates that a gate oxide 34 is formed. Gate oxide may be a composite dielectric layer of tetraethylorthosilicate (TEOS) oxide and thermal oxide or may be a single thermal oxide layer of roughly 40 angstroms to 150 angstroms in thickness. The layer 34 is a gate oxide layer which may be nitrided, fluorinated, or exposed to chlorine to enhance gate oxide performance. It is important to note that a sacrificial gate oxide process may be performed prior to the formation of gate oxide 34 to ensure a cleaner substrate surface prior to gate oxide formation. After formation of gate oxide layer 34, gate poly A (referred to also as A polysilicon) is formed via layer 36 in FIG. 6. A typical thickness for the layer of A polysilicon of a gate electrode is between 300 angstroms and 650 angstroms in thickness. In FIG. 6, a photoresist layer 38 is deposited and patterned as illustrated. The photoresist layer 38 is used as a masking layer for an ion implant step of boron which forms a doped region 40 within the well 20. The implant step to form the region 40 is typically of low energy and will typically implant boron into the P-well array as a threshold voltage (Vt) adjust measure. A second, higher energy boron implant is then performed to form punch-through protection regions within the well 20. The punch-through high energy implant is used to provide a high dose of boron around source and drain regions in the well 20 so that depletion regions around source and drain electrodes are reduced and avoid punch-through leakage phenomenon and known short channel effects.

Figure 7:
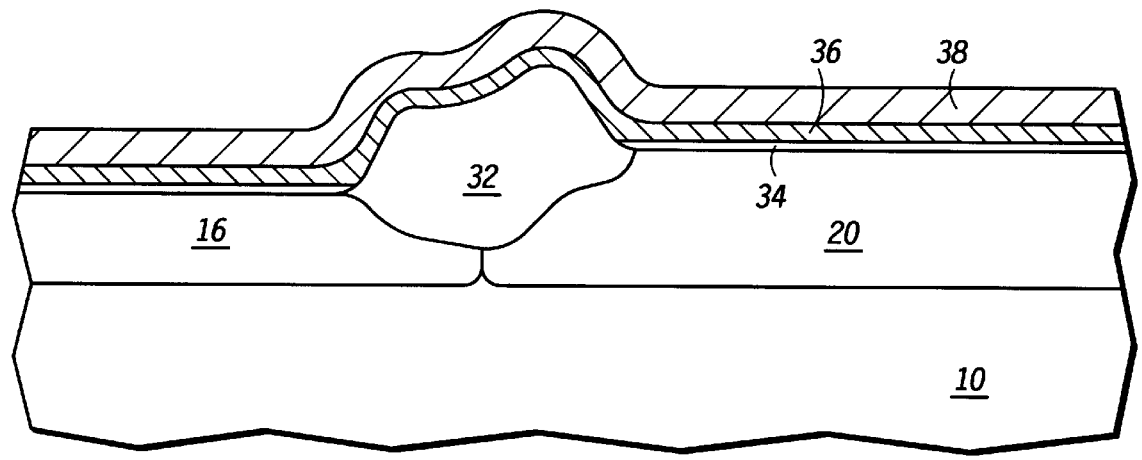

FIG. 7 illustrates that the photoresist layer 38 is removed from the substrate and that B polysilicon is deposited onto the A polysilicon layer 36. The B polysilicon layer 38 is typically thicker than the A polysilicon layer 36 and is between 2,250–3,500 angstroms in thickness. The polysilicon layers 36 and 38 contact to form a single polysilicon gate electrode layer where the only evidence of dual layer A/B deposition is a continuous crystalline boundary separating the A/B polysilicon layers. The layers 36 and 38 can be doped insitu during deposition or may be ion implanted with dopants after deposition to provide for a proper gate electrode conductivity.

Figure 8:
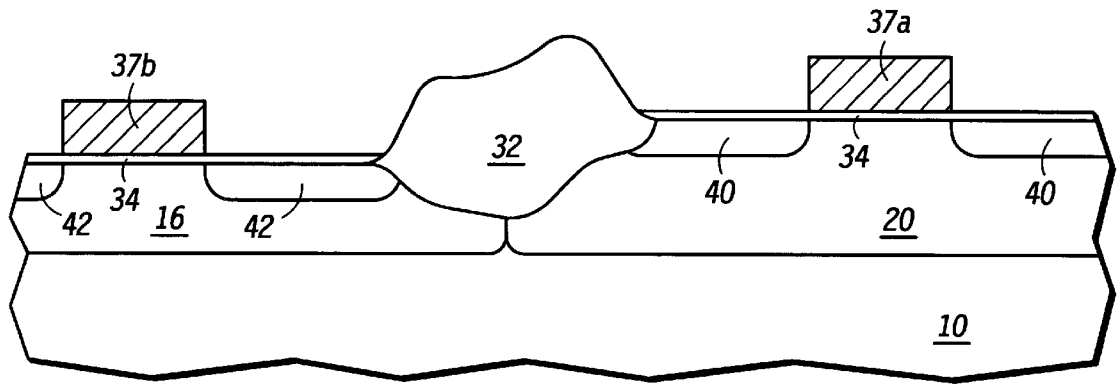

FIG. 8 illustrates that the polysilicon layers 36 and 38 are lithographically patterned and etched to form gate electrodes 37a and 37b. The gate electrode 37a overlies the P-well region 20 and the gate electrode 37b overlies the N-well region 16. Therefore, the gate electrode 37a is a gate electrode of an N-channel transistor and the gate electrode 37b is an electrode of a P-channel transistor. Accordingly, FIG. 8 illustrates that a CMOS process is used to manufacture both N-channel and P-channel transistors on a single silicon substrate 10. After patterning and etching of the gate electrodes 37a and 37b, N-type lightly doped drain regions 40 are formed within well region 20 and lightly doped drain regions 42 doped with P-type dopants are formed within well 16. Therefore, regions 40 and 42 are lightly doped drain (LDD) regions for their respective transistors.

Figure 9:
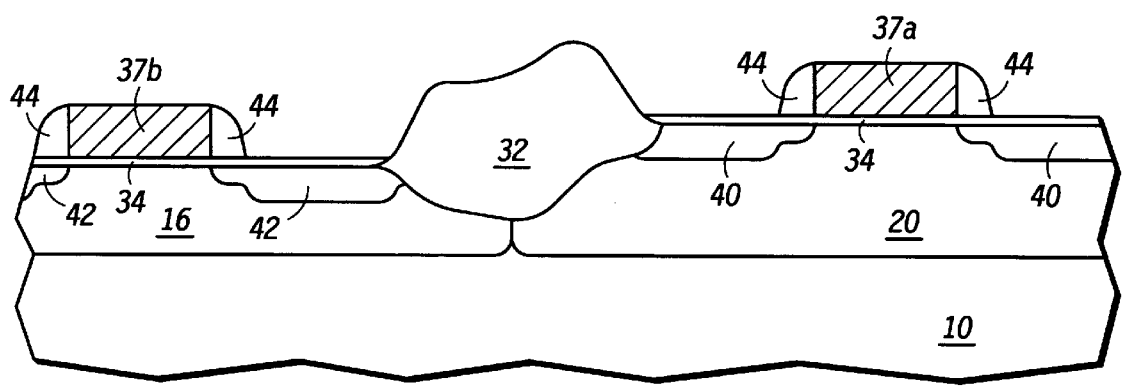

FIG. 9 illustrates that a silicon nitride layer is deposited and then etched to form silicon nitride spacers 44 laterally adjacent sidewalls of the gate electrodes 37a and 37b. A typical thickness for a silicon nitride layer when forming spacers is usually between 300 angstroms and 2,500 angstroms in thickness and the thickness deposited usually determines a base thickness of the spacer. A Tegal 901 or a like reactive ion etch (RIE) machine can be used to etch the conformal silicon nitride layer into silicon nitride spacers 44 as illustrated in FIG. 9. After the processing illustrated in FIG. 9, an optional backside ash and/or etch and RTP process can be used to perform gettering operations in the silicon substrate 10.

The nitride spacers 44 are used to self-align highly doped implants into the well regions 20 and 16 laterally adjacent the LDD regions to complete formation of the source and drain regions 40 and 42 of the CMOS transistors. While lightly doped drain (LDD) regions are typically formed with phosphorous and boron implants, highly doped drain (HDD) regions are typically formed with arsenic and $BF_2$ implants so that the HDD regions either thermally diffuse less than the LDD regions or be implanted shallower into the substrate. In FIG. 9, the formation of the CMOS transistors is structurally complete.

Figure 10:
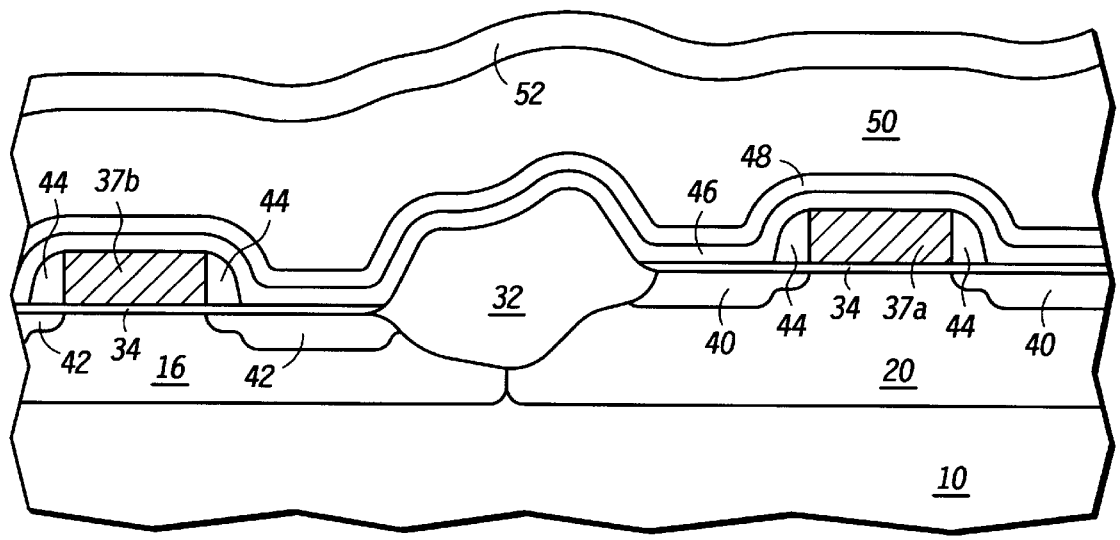

FIG. 10 illustrates that a 700 angstrom to 1,500 Angstrom TEOS layer 46 is deposited overlying the gate electrodes 37a and 37b. After depositing the layer 46, the CMOS transistors are exposed to a 390° C. hydrogen anneal process wherein the wafers are exposed to an ambient containing 4–5% hydrogen and a remainder nitrogen ($N_2$). This hydrogen anneal process is advantageous for the transistors since the hydrogen will consume dangling bonds at the Si-$SiO_2$ interface between well region 20 and gate dielectric layer 34. Likewise, dangling bonds between well region 16 and gate-dielectric layer 34 will be consumed underlying the gate electrode 37b. This consumption of dangling bonds will improve yield and stabilize threshold voltages (Vt) across the length of the wafer and the length of each IC on the wafer, thereby providing improved CMOS transistor operation.

However, hydrogen anneals will adversely effect any subsequently formed ferroelectric capacitors. Therefore, a 300–750 angstrom silicon nitride layer 48 is deposited directly onto the TEOS layer 46 directly after a time when the hydrogen anneal is performed. In a preferred form, the nitride layer 48 is not only deposited overlying the gate electrodes 37a and 37b, but the silicon nitride layer 48 is deposited on the sidewalls of the wafer and the backside of the wafer substrate 10. Preferably, a low pressure chemical vapor deposition (LPCVD) process is used, however, any CVD process may be performed. The only places which do not obtain silicon nitride deposition in a preferred form are the regions which are clamped in the deposition chamber to fix the wafer during processing. The silicon nitride layer 48 is deposited to contain the effects of the hydrogen anneal to the CMOS transistors while minimizing hydrogen anneal effects to all subsequent processing which is to occur in subsequent FIGS. 11–14. The deposition of nitride layer 48 is followed with a 5,000 to 7,000 angstrom BPSG deposition and reflow process, which results in the BPSG layer 50 in FIG. 10. After formation of the BPSG layer 50, a 1,000 to 2,000 angstrom TEOS layer 52 is deposited overlying the BPSG layer 50.

Figure 11:
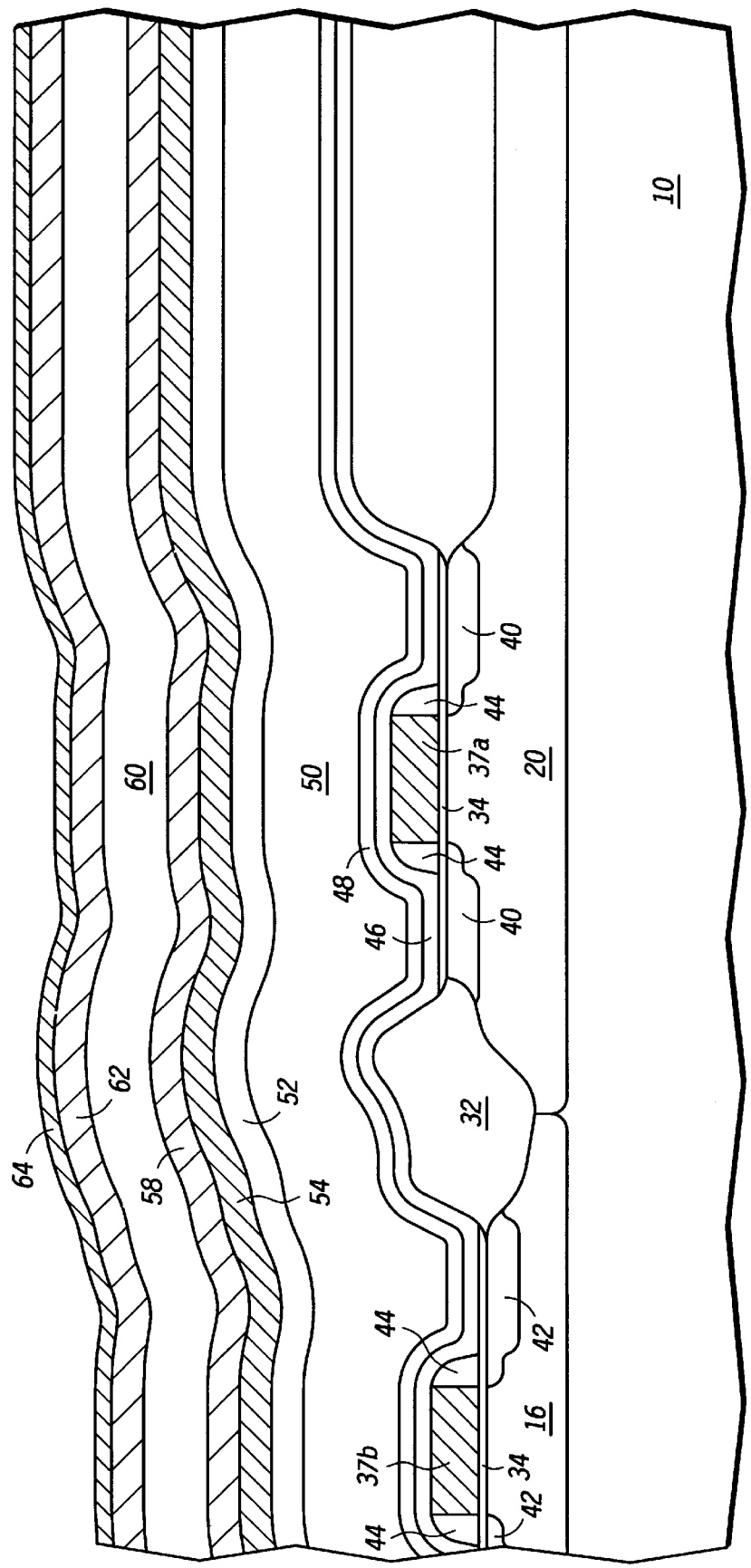

FIG. 11 illustrates the beginning of processing used to form ferroelectric capacitors which overlie the CMOS transistors. In FIG. 11, a 100 to 800 angstrom titanium layer 54 is deposited on top of the 1,500 angstrom TEOS layer 52. A 650° C. $O_2$ 30-minute oxidation process is then used to convert the 100–800 angstroms of titanium into approximately 175–1,400 angstroms of titanium dioxide which is illustrated in FIG. 11 by the layer 54. A 2,250 to 4,000 angstrom thick layer of platinum is then deposited as a layer 58, wherein layer 58 contacts the titanium oxide layer 54. After formation of layer 58, a strontium bismuth tantalum oxide (Y1) or like ferroelectric material is spun onto the wafer 58 to form a ferroelectric dielectric 60. After depositing or spinning the layer of ferroelectric material 60, an oxygen anneal process is performed to remove the organic content of the spin coat material and to crystallize the ferroelectric layer into the desired ferroelectric crystal phase. This oxygen anneal is typically between 600° C. and 800° C. within a thermal exposure time range of at least one minute to many tens or hundreds of minutes. Other ferroelectric deposition techniques are known and may be used, but all ferroelectric deposition techniques typically require a high temperature process or an anneal in an oxygen environment. A 1,500 to 3,000 Angstrom platinum layer 62 is then deposited followed by a 100–300 angstrom titanium layer which is oxidized to form a titanium oxide layer 64 which is 175–525 angstroms thick. Therefore, layers 54 and 58 form a first ferroelectric capacitor electrode and layers 62 and 64 form a second ferroelectric capacitor electrode where layer 60 forms the capacitor dielectric wherein layer 60 is a ferroelectric material.

Figure 12:
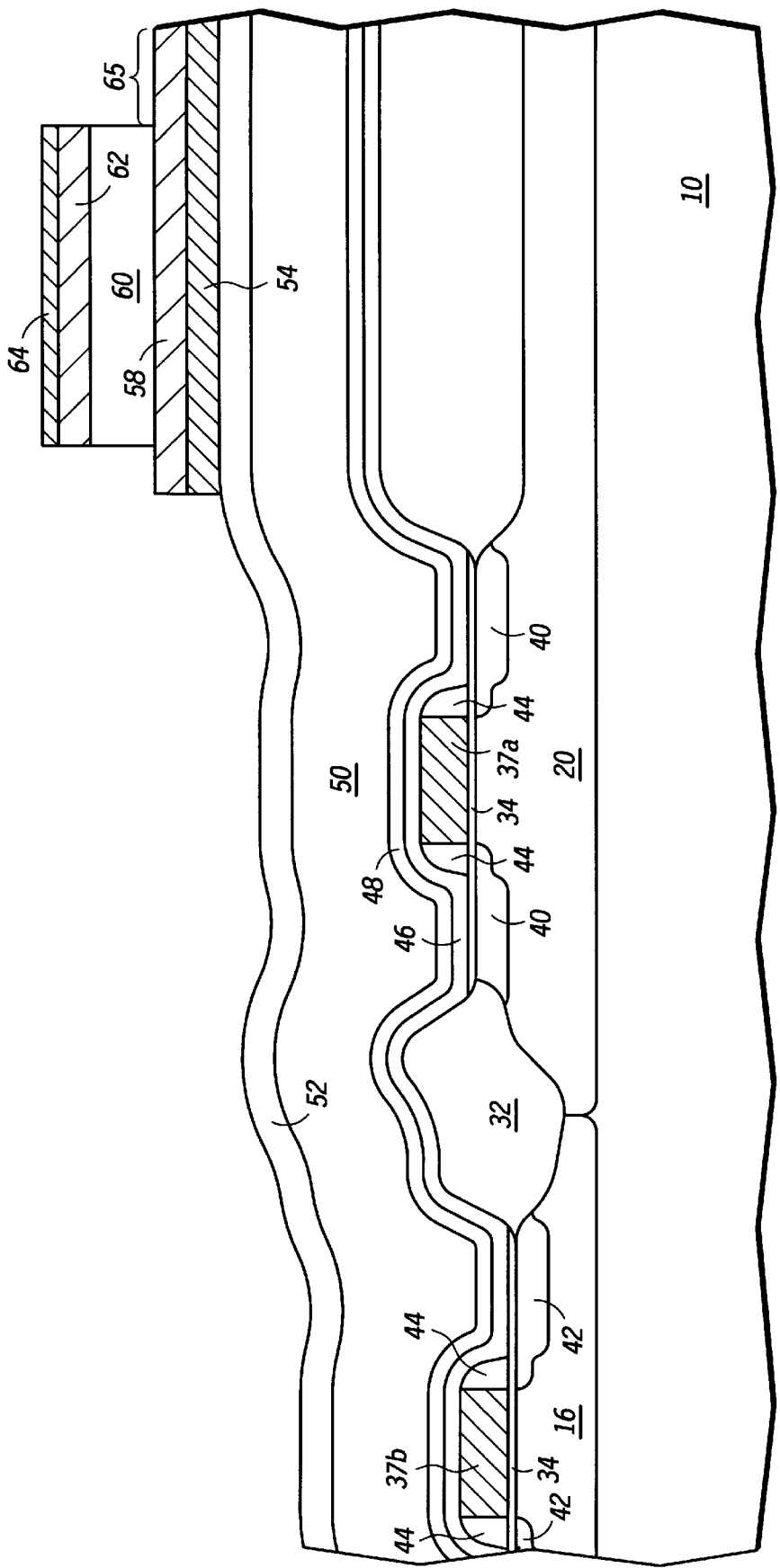

FIG. 12 indicates that a first photolithographic process is used to pattern and etch the top electrode comprising layers 62 and 64 and etch the ferroelectric material 60. It is important to note that the electrode comprising layers 62 and 64 may be etched in a step photolithographically different from the step used to etch layer 60 in a triple-tiered configuration ("wedding cake") manner. However, FIG. 12 illustrates that the top electric comprising layers 62 and 64 are self-aligned to the capacitor dielectric 60 etched in FIG. 12. A second photolithographic step is then used to define the layers 58 and 54 to leave behind a first electrode contact portion 65. Additionally, layers 58 and 54 can be patterned to connect a plurality of individual capacitors as appropriate for the particular circuit layout which is chosen. In essence, FIG. 12 illustrates that all of the layers 54 through 64 are lithographically patterned and etched to form individual capacitors for individual ferroelectric storage cells.

Figure 13:
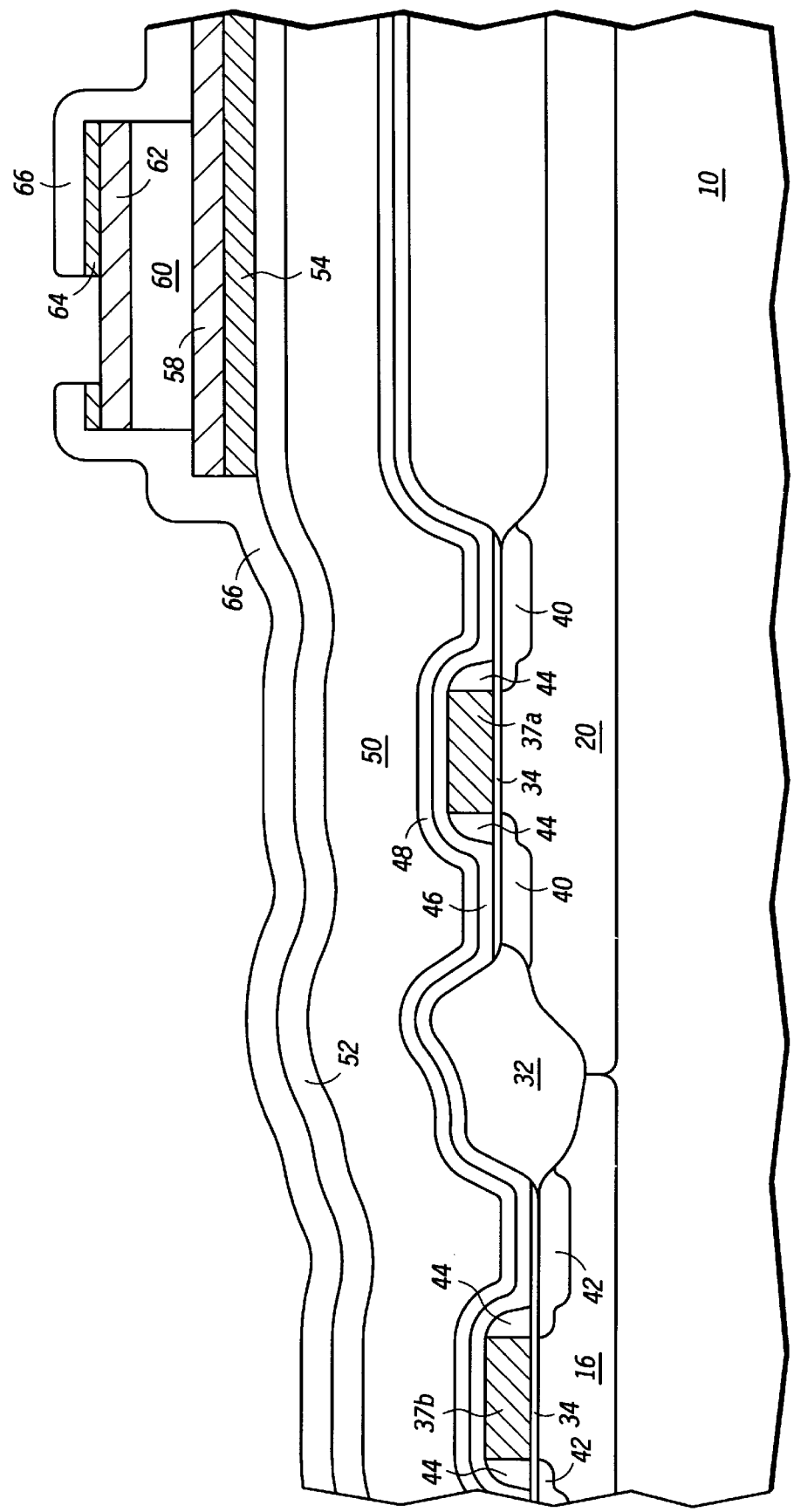

It is important to note that other operational oxide anneals may be performed throughout the patterning and etching of the layers illustrated in FIG. 12 to intermittently correct damage to the ferroelectric material by one or more of plasma exposure, thermal cycling, or mechanical strain. FIG. 13 illustrates that a 3,000 to 5,000 angstrom TEOS layer 66 is deposited. Openings are then formed through layer 66 to expose the first and second electrodes of the ferroelectric capacitor in FIG. 13. The layer 64 will not be a good conductor and is etched away if at all possible to expose the platinum of layer 62 for superior electrical contact. The contact region 65 is used to contact the bottom electrode or first electrode of the ferroelectric capacitor whereas contact is directly made to a capacitor electrode portion of layer 64 to contact the second electrode of the ferroelectric capacitor.

Figure 14:
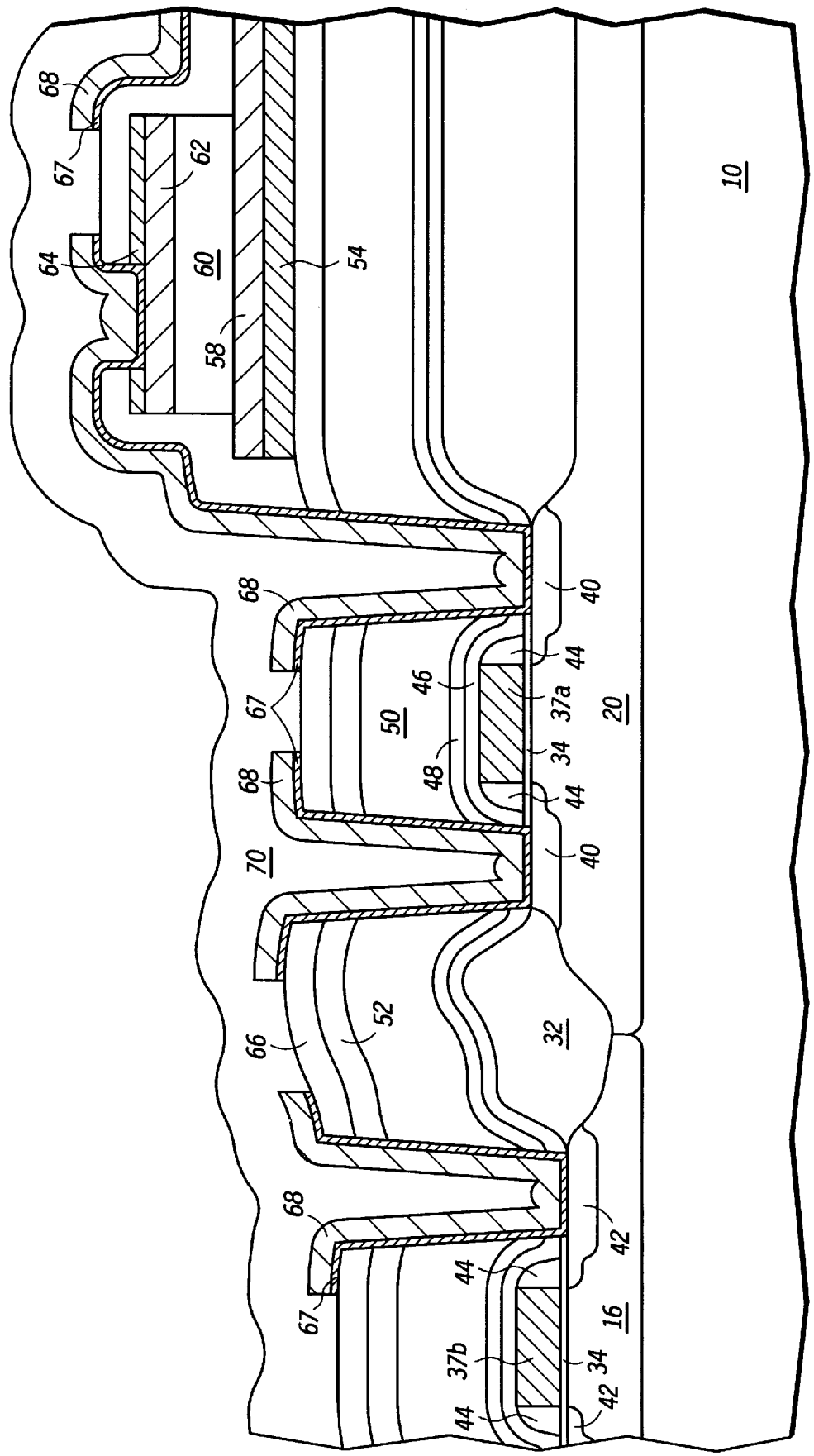

FIG. 14 illustrates that after the openings are formed to the capacitor in FIG. 13, a second photolithographic and etch process is then used to form openings through the layers 66, 52, 50, 48, 46, and 34 to expose source and drain regions 40 and 42 where exposure is needed in order to form electrical contacts. A similar set of contact holds are formed to contact the gate electrode 37a and 37b where these gate contacts are not illustrated in FIG. 14. After formation of all of the contact openings in FIG. 14, a tantalum nitride metal barrier layer 67 is deposited within the contact openings. The layer 67 may be either total tantalum nitride, a first layer of titanium and a second layer of tantalum nitride, or a first layer of tantalum and a second layer of tantalum nitride. The layer 67 may be made from any barrier material other than tantalum nitride, such as titanium nitride, tantalum, or titanium tungsten, however, tantalum nitride or a tantalum nitride composite is preferred. The formation of layer 67 is followed by a 5,000 to 7,000 angstrom aluminum deposition to form an aluminum layer 68. The aluminum layer is typically a 98% Aluminum, 1% silicon, 1% copper alloy. A photolithographic process is used to pattern and etch the aluminum layer 68 and the tantalum nitride layer 67 into individual contact regions as illustrated in FIG. 14.

FIG. 14 illustrates that the transistor gate electrode 37a is coupled via one of these metal contact regions 67/68 to the ferroelectric capacitor formed near the right-hand side of FIG. 14. Therefore, the transistor gated gate electrode 37a and the capacitor illustrated in a right most portion of FIG. 14 are coupled together electrically to form a single ferroelectric memory cell in a configuration that is similar to the circuitry needed for a single transistor DRAM cell. After the patterning and etching of the layer 68 and the layer 67, the ferroelectric material 60 requires an oxygen ($O_2$) anneal in order to repair mechanical and charge/plasma damage resulting in the ferroelectric material from all photolithographic, dielectric deposition, and etch processing occurring from FIG. 11 to FIG. 14. For this anneal and any previous oxygen anneals, the substrate is submersed in a preferably pure $O_2$ environment at a temperature of 300° C. to 425° C. for roughly 30 minutes. Oxygen anneals are typically either detrimental to CMOS transistor operation or do not anneal transistor damage properly to increase transistor yield. However, the nitride layer 48 along with the barrier layer 67 protects the CMOS devices gated by gates 37a and 37b from any damage from the oxygen anneal. Therefore, the ferroelectric material 60 can be cured optimally using an oxygen anneal while CMOS transistors are not detrimentally affected by this oxygen anneal process and instead maintain their hydrogen-annealed high yield.

After oxygen annealing the ferroelectric material for improved yield and performance, a several thousand angstrom TEOS layer 70 is deposited as passivation isolation. Holes are then etched through the passivation layer 70 to expose contact bond pads of the IC and formation of the integrated circuit is ready for conventional packaging and testing.

In summary, FIGS. 1–14 teach a method by which a hydrogen anneal may be used to increase yield and performance of CMOS transistors while not damaging ferroelectric material. In the same process, an oxygen anneal is used to benefit the ferroelectric material while not affecting adversely the operation of CMOS transistor arrays. Therefore, overall performance and yield of CMOS ferroelectric ICs are improved without adverse effects to any portion of the IC.

While the present invention has been illustrated and described with reference to specific embodiments, further modification and improvements will occur to those skilled in the art. It is to be understood that this invention is not limited to the particular forms illustrated herein, and it is intended in the appended claims to cover all modifications that do not depart from the spirit and scope of this invention. For example, any type of ferroelectric material may be used as the ferroelectric layer 60 in FIG. 14. More than one metal layer may be deposited on top of the substrate so that the process illustrated in FIGS. 1–14 may be integrated into a 2, 3, or 4 layer metal process. More than one layer of polysilicon may be deposited on the substrate to allow for the formation of both ferroelectric memory cells and other devices on the same substrate. Conductive electrodes of the capacitor may be replaced with other conductive material so that platinum and/or titanium need not be used. Titanium barriers and tantalum nitride barriers as taught herein may be interchanged and other conductive refractory metals and refractory metal oxides may be used as barrier layers. Dielectric layers as taught herein may be formed using any dielectric material. The hydrogen anneal taught herein recites that 4–5% hydrogen should be used, but it should be clear that any other concentration of hydrogen may be used, such as 3%–7%. Specific temperatures, times, thicknesses, doses, energies, etc. cited herein are preferred quantities and other quantities outside of the ranges cited herein as preferred may be used.

It is important to note that the oxygen anneal taught herein is performed after aluminum metallization steps. This oxygen anneal after metallization is unusual since it was widely believed that any oxygen annealing after aluminum formation would oxidize and damage the aluminum. Experimental results have shown that the post metal oxygen anneal taught herein is not significantly metal-destructive as was initially believed by the teachings of the art.

Any ferroelectric material such as lead zirconate titanate (PZT), barium titanate, calcium titanate, bismuth titanate, strontium titanate, lead zirconate, lead lanthanum zirconate titanate, lead niobium zirconate titanate, lead lanthanum niobium zirconate titanate, strontium bismuth tantalum oxide (Y1), strontium bismuth niobate, strontium bismuth niobate tantalate, barium strontium titanate, and/or lead titanate, either alone or in any combination may be used herein.

What is claimed is:

1. A method for forming a semiconductor device, the method comprising the steps of:

forming a plurality of transistors overlying a substrate;

forming a barrier layer overlying the plurality of transistors;

forming ferroelectric capacitors overlying the barrier layer;

forming a plurality of contact openings between the ferroelectric capacitors and the plurality of transistors; and electrically coupling the ferroelectric capacitors to the plurality of transistors using a conductive layer comprising tantalum nitride and aluminum.

2. The method of claim 1 wherein the step of forming a barrier layer comprises:

forming the barrier layer as a silicon nitride layer.

3. The method of claim 1 further comprising:

exposing the plurality of transistors to a hydrogen/nitrogen anneal at a temperature which is elevated above room temperature before the step of forming the barrier layer, the hydrogen/nitrogen anneal improving yield of the plurality of transistors while the barrier layer protects the ferroelectric capacitors which are subsequently formed over the barrier layer.

4. The method of claim 3 wherein the step of electrically coupling the ferroelectric capacitors comprises:

forming the tantalum nitride as: (1) a portion of a conductive interconnect connected to a capacitor electrode of the ferroelectric capacitors; and (2) an additional hydrogen or nitrogen barrier layer in addition to said barrier layer wherein the additional hydrogen or nitrogen barrier layer lies within the plurality of contact openings and aid said barrier layer in protecting the ferroelectric capacitors from one or more of nitrogen or hydrogen used in the hydrogen/nitrogen anneal.

5. The method of claim further comprising:

exposing the ferroelectric capacitors to an oxygen anneal at a temperature which is elevated above room temperature, the oxygen anneal improving yield of the ferroelectric capacitors while the barrier layer protects the plurality of transistors from the oxygen anneal.

6. The method of claim 1 wherein the step of forming ferroelectric capacitors comprises:

forming the ferroelectric capacitor with at least one capacitor plate that contains platinum wherein the tantalum nitride is a barrier layer between the platinum and the aluminum.

7. The method of claim 1 wherein the step of electrically coupling the ferroelectric capacitors comprises:

forming the conductive layer comprising all of tantalum, tantalum nitride, and a non-refractory conductive metal.

8. The method of claim 1 wherein the step of electrically coupling the ferroelectric capacitors comprises:

forming the conductive layer comprising all of titanium, tantalum nitride, and a non-refractory conductive metal.

9. A method for forming a ferroelectric device, the method comprising the steps of:

forming a ferroelectric capacitor;

forming a dielectric layer over the ferroelectric capacitor;

defining at least one open in the dielectric layer to expose at least one portion of the ferroelectric capacitor;

forming a barrier layer comprising tantalum nitride within the at least one opening; and forming a metallic material over the barrier layer.

10. The method of claim 9 wherein the step of forming a metallic material comprises:

forming the metallic material from a material which comprises aluminum.

11. The method of claim 9 wherein the step of forming a barrier layer comprises:

forming the barrier layer by depositing a first layer of tantalum followed by a second layer of tantalum nitride.

12. The method of claim 9 wherein the step of forming a barrier layer comprises:

forming the barrier layer by depositing a first layer of titanium followed by a second layer of tantalum nitride.

13. The method of claim 9 wherein the step of defining at least one opening comprises:

defining the at least one opening to expose a platinum material portion as the at least one portion of the ferroelectric capacitor.

14. The method of claim 9 further comprising:

forming at least one transistor before forming the ferroelectric capacitor;

annealing the at least one transistor in an environment which contains hydrogen; and depositing a nitride layer over the at least one transistor and before forming the ferroelectric capacitor to contain the hydrogen from damaging access to the ferroelectric capacitor.

15. The method of claim 14 further comprising:

annealing the ferroelectric capacitor in an ambient comprising oxygen whereby the nitride layer protects the at least one transistor from the oxygen.

16. A method for forming a ferroelectric device comprising the steps of:

forming a plurality of CMOS transistors over a surface of a substrate;

annealing the CMOS transistors via a hydrogen anneal within a temperature range of 200° C. to 500° C.;

forming a nitrogen-containing barrier layer over the CMOS transistors after the step of annealing;

forming ferroelectric capacitors over the nitrogen-containing barrier, the ferroelectric capacitors each having electrodes that contain refractory metal and ferroelectric material located between the electrodes;

forming at least one opening to at least one electrode of each ferroelectric capacitor;

forming a conductive barrier layer within the openings, the conductive barrier layer comprising a refractory metal;

forming a non-refractory metal over the conductive barrier layer and within the openings;

annealing the ferroelectric material using an oxygen anneal at a temperature within a range of 300° C. to 500° C. wherein the nitrogen-containing barrier protects the CMOS transistors from the oxygen anneal and protects the ferroelectric capacitors from hydrogen previously used in the hydrogen anneal.

17. The method of claim 16 wherein the step of forming the nitrogen-containing barrier layer comprises:

forming the nitrogen-containing barrier layer on a top active surface of the substrate and on a backside inactive surface of the substrate.

18. The method of claim 16 wherein the step of forming the conductive barrier layer comprises:

forming the conductive barrier layer so that the conductive barrier layer comprises tantalum nitride.

19. The method of claim 16 wherein the step of annealing the CMOS transistors comprises:

annealing the CMOS transistors using a hydrogen anneal which also contain nitrogen in addition to hydrogen wherein the nitrogen content in the hydrogen anneal is greater than the hydrogen content in the hydrogen anneal.

20. The method of claim 16 wherein the step of forming the non-refractory metal comprises:

forming the non-refractory metal comprising aluminum while forming the at least one capacitor electrode comprising platinum.

* * * * *